(12) United States Patent
Summit

(10) Patent No.: US 9,519,733 B2
(45) Date of Patent: Dec. 13, 2016

(54) SYSTEM AND METHOD FOR DESIGNING AND FABRICATING STRING INSTRUMENTS

(71) Applicant: 3D Systems, Inc., Rock Hill, SC (US)

(72) Inventor: Scott Summit, Mill Valley, CA (US)

(73) Assignee: 3D Systems, Inc., Rock Hill, SC (US)

( * ) Notice: Subject to any disclaimer, the term of this patent is extended or adjusted under 35 U.S.C. 154(b) by 560 days.

(21) Appl. No.: 14/050,709

(22) Filed: Oct. 10, 2013

(65) Prior Publication Data

US 2014/0100825 A1    Apr. 10, 2014

Related U.S. Application Data

(60) Provisional application No. 61/712,173, filed on Oct. 10, 2012.

(51) Int. Cl.
*G06G 7/48* (2006.01)
*G06F 17/50* (2006.01)
*G10H 3/18* (2006.01)
*G10H 1/00* (2006.01)

(52) U.S. Cl.
CPC ........... *G06F 17/50* (2013.01); *G10H 1/0008* (2013.01); *G10H 3/188* (2013.01)

(58) Field of Classification Search
CPC ........ G10H 1/32; G10H 3/188; G10H 1/0016; G10H 1/0008; G06Q 50/00; G09B 51/065; G07F 11/00; A63F 13/06; G01D 3/00

See application file for complete search history.

(56) References Cited

U.S. PATENT DOCUMENTS

| | | | | |
|---|---|---|---|---|
| 5,270,475 A * | 12/1993 | Weiss | ............ | G10H 1/0008 84/454 |
| 6,995,310 B1 * | 2/2006 | Knapp | ............ | G09B 5/065 84/462 |
| 7,345,236 B2 * | 3/2008 | Worrall | ............ | G10H 1/0016 434/350 |
| 8,207,438 B2 * | 6/2012 | Humphrey | ............ | G06Q 50/00 84/609 |
| 8,829,318 B1 * | 9/2014 | DeLaFrance | ............ | G10H 1/32 84/292 |
| 2005/0211768 A1 * | 9/2005 | Stillman | ............ | G07F 11/00 235/381 |
| 2006/0107826 A1 * | 5/2006 | Knapp | ............ | G09B 5/065 84/724 |
| 2009/0216483 A1 | 8/2009 | Young | | |

(Continued)

FOREIGN PATENT DOCUMENTS

WO    2010148431    12/2010

OTHER PUBLICATIONS

Jason, "Kozm Guitars—Digital Lutherie", http://www.guitarsite.com/news/features/KOZM-Guitars-Digital-Lutherie, 2011.*

(Continued)

*Primary Examiner* — Kandasamy Thangavelu
(74) *Attorney, Agent, or Firm* — Staniford Tomita LLP

(57) ABSTRACT

A computer provides a graphical user interface that allows designers to design string instruments. The dimensions and shape of the string instrument design can be altered using controls. The wind instrument design can be stored in a database and transmitted to a 3 dimensional printer which can fabricate the string instrument.

20 Claims, 13 Drawing Sheets

(56) References Cited

U.S. PATENT DOCUMENTS

| | | | |
|---|---|---|---|
| 2010/0087937 A1* | 4/2010 | Tolson | G10H 3/188 700/94 |
| 2010/0307315 A1* | 12/2010 | Swanson | G10D 3/00 84/304 |
| 2011/0075395 A1* | 3/2011 | Spurgeon | A63F 13/06 362/84 |
| 2011/0162506 A1 | 7/2011 | Yokoyama | |
| 2012/0174736 A1* | 7/2012 | Wang | G10H 1/0008 84/622 |

OTHER PUBLICATIONS

"KOZM Guitars—Digital Lutherie—CAD/CAM Technology", www.kozmguitars.com.*

"Frank Montag Guitar Editors, V1.0", 2011, www.frankmontag.com.*

"SC/SG Guitar Editor", www.frankmontag.com 2012.*

New World Encyclopedia, "String instrument", Oct. 25, 2016.*

PCT International Searching Authority for International Application No. PCT/US2013/064261, mailed Mar. 12, 2014 (2 pages).

PCT Written Opinion of the International Searching Authority for International Application No. PCT/US213/064261, mailed Mar. 12, 2014 (5 pages).

SC Guitar, Singlecut Guitar Editor V2.0, franmontag.com, 2011; retrived from Internet: http://www.frankmontag.com/sc_guitar.htm.

Ren et al. Designing Virtual Instruments with Touch-Enabled interface. ACM 978-1-4503-1016-1/12/05. May 5, 2012; retrieved from Internet http://gamma.cs.unc.edu/tabletopensemble/virtualinstrumentscasestudy.pdf.

AIRD Musical Instrument Modelling Using Digital Waveguides. University of Bath. 2002; retrieved from internet: http://www.cs/bath/ac.uk-mapma/thesis.pdf.

Valimaki et al. Tutorial Article. Virtual musical instruments-natural sound using physical models. Cambridge University Press, 1996; retrieved from internet: http://imi.aau.dk/-sts/classes/ia06/valimkitakala.pdf.

* cited by examiner

SYSTEM AND METHOD FOR DESIGNING AND FABRICATING STRING INSTRUMENTS

CROSS REFERENCE TO RELATED APPLICATIONS

This application claims priority to U.S. Provisional Patent Application No. 61/712,173, "Parametric Guitar" filed Oct. 10, 2012 which is hereby incorporated by reference in its entirety.

BACKGROUND

An acoustic guitar, ukulele or other similar stringed instruments make sound by reverberating strings that are connected to the upper surface of the guitar body. These cause that surface to vibrate, like the cone of a speaker. The body of the guitar is rigid, and the shape of the enclosed volume influences the resulting sound, tone, volume, and sustain. A larger body, for example, will have a louder sound. A body which is wider at the base end of the guitar (the widest region), will have more bass response.

Modern acoustic guitars are created to make a sound as intended by the manufacturer, based on their market expectations. A guitar player often prefers, however, to create a sound that is uniquely theirs, unlike any store-bought guitar. A custom guitar, though chosen often by professional musicians, is traditionally difficult to come by, since it requires a dialog with a luthier (guitar maker). Even then, the resulting sound is limited by the woods and the shapes that can be created from wood. Special features, such as internal textures, external textures, special structural ribbing, graphics, etc, are often not possible, as they lie beyond the realm of the traditional luthier's skills. What is needed is an improved system and method for designing and creating guitars or other stringed instruments.

SUMMARY OF THE INVENTION

A server computer provides a graphical user interface on client computers coupled to the server computer through a network. The user interface includes a plurality of controls that allows designers to design string instruments. The design of the string instrument can include length, thickness and width of a body as well as shape controls for altering the shape of the string instrument. The design can then be stored in a database and forwarded to a 3D printer to fabricate the string instrument.

Traditional string instruments are made of planar sheets of wood which limits the possible design variations. Because the 3D printer can fabricate the string instrument in any shape or geometry, the string instruments design is not limited to planar soundboards or backs. Similarly, the side surfaces do not need to be perpendicular to the soundboards and back surfaces. In addition to improved structural variations, the inventive system can also allow ornamental patterns and/or textures to be easily added to the surface designs of the string instruments.

In an embodiment, the inventive system may be able to analyze the shape of the string instrument design through vibration analysis and predict what the string instrument may sound like. The system can then display a description of the predicted sound or play a portion of music that matches the predicted sound qualities of the string instrument design.

BRIEF DESCRIPTIONS OF THE DRAWINGS

DETAILED DESCRIPTION

Figure 1:
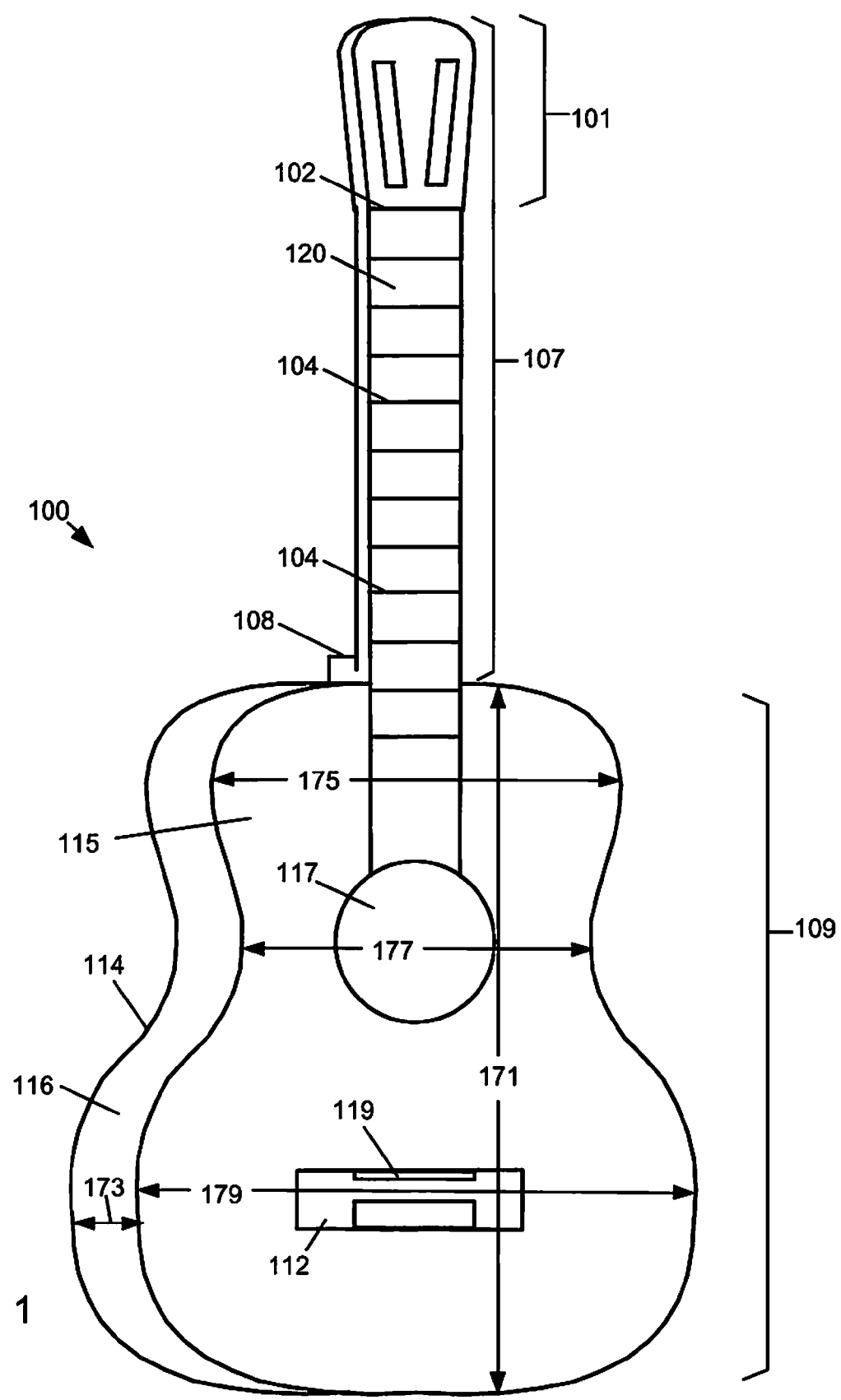
FIG. 1 illustrates a guitar.

The inventive system and method is directed towards an improved system and method for creating a user-customizable guitar or other string instruments. For simplicity the string instrument will be described as a guitar. However, it will be understood by people of ordinary skill in the art that the inventive system and method can be used to design and fabricate any other type of string instrument. In an embodiment, the inventive system can include a computer having a user interface which is used to design a shape and structure of a guitar. The designer can alter the shape and structure of the guitar as desired. The electronic design data can then be stored and used to fabricate the guitar using an additive fabrication machine such as a 3D printer.

With reference to FIG. 1a basic acoustic guitar 100 is illustrated. The guitar 100 can include a plurality of guitar components including: a headstock 101, a nut 102, frets 104, a neck 107, a heel 108, a guitar body 109, a bridge 112, a back 114, a soundboard 115, body sides 116, a sound hole 117, a saddle 119 and a fretboard 120. In an embodiment, the user interface can allow the designer to control the shape, size and locations of each of the guitar 100 components.

The headstock 101 is located at the end of the guitar neck 107 farthest from the body 109 that is fitted with machine heads that adjust the tension of the strings, which in turn affects the pitch. The nut 102 is a small strip at the joint where the headstock 101 meets the fretboard 120. Grooves in the nut 102 guide the strings onto the fretboard 120, giving consistent lateral string placement. The nut 102 defines the endpoints of the strings' vibrating length. The nut 102 must be accurately formed. A defective nut 102 can contribute to tuning problems due to string slippage or string buzz.

The fretboard 120 is an elongated structure that can include frets 104 that extend across the width of the fretboard 120 at the top of the neck 107. In different embodiments, the fretboard 120 can be flat in a classical guitar design or slightly curved across the width in an acoustic guitar design. The curvature of the fretboard 120 can be measured by the "fretboard radius," which is the radius of a hypothetical circle of which the fretboard 120 surface constitutes a segment. A smaller fretboard radius produces a more curved fretboard. Most modern guitars feature a 12" fretboard radius, while older guitars from the 1960s and 1970s usually feature a 6-8" fretboard radius.

Frets 104 are raised structures that extend along the width of the fretboard. The frets 104 located at exact points that divide the scale length in accordance with a specific mathematical formula. Pressing a string against a fret 104 determines the strings' vibrating length and its resultant pitch. The pitch of each sequential fret 104 can be defined at a half-step interval on the chromatic scale. Standard classical guitars have 19 frets. Other guitars may have 21 to 27 frets.

Frets 104 are laid out to accomplish an equal tempered division of the octave. Every twelve frets 104 represents one octave. The twelfth fret 104 divides the scale length exactly into two halves, and the 24th fret 104 position divides one of those halves in half again. The ratio of the spacing of two consecutive frets is the twelfth root of two.

In the prior art, luthiers had to manually determine fret positions. Because the twelfth root of two is a complicated algebraic irrational number, luthiers typically use the constant 17.817. If the nth fret 104 is a distance x from the bridge 112, then the distance from the (n+1)th fret 104 to the bridge 112 is x−(x/17.817). Because the inventive system is capable of easily solving mathematical equations, the computer can automatically define the locations of all frets 104 once the designer selects the position of the first or any other fret 104 on the fretboard 120.

The inventive system can allow the designer to utilize various different types of frets 104. For example, frets 104 are available in several different gauges and can be fitted according to end user's preference. For example, in an embodiment, the system can use "jumbo" frets 104, which have much thicker gauge than normal frets 104. The jumbo frets 104 can allow a vibrato playing technique from pushing the string down harder and softer. In an embodiment, the system can provide "Scalloped" fretboards 120, where the fretboard 120 has a "scooped out" or concave outer surface between the frets 104 allows the guitar 100 to be played with a dramatic vibrato effect. In other embodiments, the inventive system can provide fine frets 104, much can be flatter and allow a very low string-action.

A guitar's frets 104, fretboard 120 and headstock 101 are formed as features of the neck 107. The bending stress on the neck 107 can be considerable, particularly when heavier gauge strings are used. The ability of the neck 107 to resist bending is important to the guitar's ability to hold a constant pitch during tuning and when strings are fretted. The rigidity of the neck 107 with respect to the body 109 of the guitar 100 is one determinant of a good instrument versus a poor one. The design shape of the neck 107 may also be controlled by the user interface. Some aspects to consider in a guitar neck 107 may be the overall width of the fretboard 120, the distance between the frets 104 and the shape of the frets 104.

In an embodiment, the neck 107 of the guitar 100 can be manufactured from the unibody head neck 107, central body 109 unit with an integrated fingerboard for the similar feel of the existing neck. The unibody construction eliminates the inherent mechanical instability of the head neck junction. In this configuration, the deflections, creep or deformation of the neck 107 that can lead to erosion of the acoustic performance characteristics over time and differential sound quality along the length of the neck 107 can be eliminated.

The heel 108 is the point at which the neck 107 is connected to the body 109 of the guitar 100. In an embodiment, classical guitar design can have a neck and headblock shape known as a "Spanish heel." Although, the entire guitar 100 can be designed to be formed as a unitary structure, in other embodiments, the design can be used to design and fabricate just the body 109 of the guitar 100. The body 109 can then be connected to a separate neck 107, fretboard 120, frets 104 and headstock 101. The sound of the guitar 100 can be mostly defined by the shape, volume and construction of the body 109. Thus, in an embodiment, the inventive system and method can be used for designing and fabricating just the body 109. In the separate body 109 embodiments, known connection methods can be used between the neck 107 and the body 109. Commonly used set neck joints include mortise and tenon joints, dovetail joints and Spanish heel neck joints. Bolt-on necks can also be used which offer greater flexibility in the guitar's set-up, and allow easier access for neck joint maintenance and repairs.

In acoustic guitars 100, string vibration is transmitted through the bridge 112 and the saddle 119 to the body 109 via the soundboard 115. The soundboard 115 which must provide the required mechanical strength and the ability to transfer mechanical energy from the strings to the air within the guitar body 109. Sound is further shaped by the characteristics of the guitar body's resonant cavity.

In an acoustic string instrument, the body is a major determinant of the overall sound quality. The majority of the instrument's sound is heard through the vibration of the guitar soundboard 115 as the energy of the vibrating strings is transferred to it.

The acoustic guitar body 109 has a sound hole 117 through which sound projects. The sound hole 117 is usually a round hole in the soundboard 115 of the guitar 100 under the strings. Air inside the body 109 vibrates as the strings vibrate the guitar soundboard 115 and body 109. The acoustic response of the air cavity at different frequencies is characterized, like the rest of the guitar body, by a number of resonance modes at which it responds more strongly.

String instruments with larger area soundboards 115 can create louder volume levels than similar string instruments with smaller areas soundboards 115. The bridge 112 on an acoustic guitar 100 transfers the vibration from the strings to the soundboard 115, which vibrates the air inside of the body 109 of the guitar 100, thereby amplifying the sound produced by the strings. The bridge 112 also holds the strings in place on the body 109. The saddle 119 of a guitar 100 is a part of the bridge 112 that physically supports the strings and provides the end point for the string's vibration at the correct location for proper intonation. On acoustic guitars, the saddle 119 transfers the vibrations through the bridge 112 into the soundboard 115 of the guitar 100.

The bridge 112 and saddle 119 to bridge 112 connection of the guitar 100 are areas of design that are constrained by current manufacturing methods. Strength limitations of the soundboard 115 supporting the bridge 112 dictates use of broader bridges 112 that impose on the acoustic zones of the sound board active acoustic regions of the soundboard 115 [Sentence needs rewording]. In contrast, the use of additive manufacturing allows for focal reinforcement of the bridge 112, and unibody construction of the saddle bridge connection using the inventive system and method.

In an embodiment, the inventive system can be used to create a unibody construction of the bridge 112 and saddle 119 portion of the guitar 100 which can have a single inset saddle 119. The inset portion can be reinforced with an thickened rim produced with additive manufacturing. Typical bridges 112 have an onset construction and modular undersurface reinforcement. Use of wood and the assembly in the traditional guitar creates a broader footprint that impacts the vibration of the soundboard 115. The additive fabricated guitar 100 is structurally more stable and has a smaller structural footprint which is less likely to dampen the vibration and acoustic output of the soundboard 115. The additive fabrication process can also allow for non-linear design of the structures supporting the bridge 112 for improved acoustic transmission.

The basic shape of the body 109 can significantly control the sound of the guitar 100. In an embodiment, the graphical user interface can be used to control the design of the guitar body 109. The body 109 volume can be controlled by altering the length 171 and thickness 173 of the body design. The shape design of the body 109 can be controlled by altering the upper bout 175, the waist 177 and the lower bout 179 widths of the body 109 along the length 171.

A significant benefit of the inventive system lies in the flexibility of the geometry creation. Because the guitar can be 3d printed, the geometry is unconstrained by the traditional fabrication construction and physical properties inherent in wood. For example, traditional guitars have substantially planar front and back surfaces and the edges of the guitars are substantially perpendicular to the front and back surfaces. In contrast, a 3D printed guitar can include a body that includes slight contours or contoured transitions. Thus, the inventive system can be used to create a guitar which has enhanced acoustic properties, since none of the traditionally requisite internal structural parts and components will interfere with the acoustic waves and sound produced by the guitar body. Smooth, uninterrupted internal surfaces in the resonating chamber of the guitar body may improve the guitar's overall tonal range, volume, and/or sustain.

Figure 2:
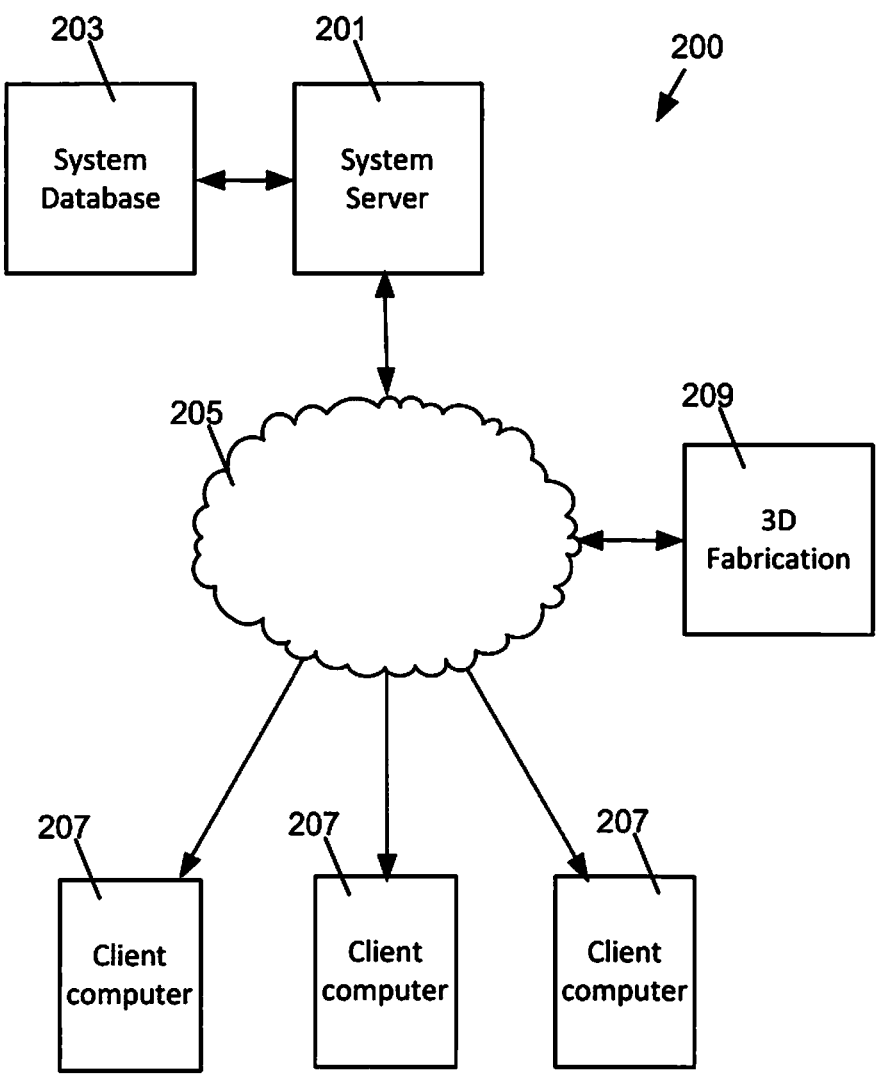
FIG. 2 illustrates a block diagram of a computer system used to design the string instruments.

In an embodiment shown in FIG. 2, a computer system 200 includes: a server 201, a database 203, a network 205, client computers 207 and a 3D fabrication system 209. The client computers 207 can be configured to allow a user to manipulate a virtual 3D CAD model of a guitar or other instrument. A designer can use a client computer 207 to log onto a website to access a user interface provided by the server. The website can provide 3D CAD models of guitars and/or other string instruments.

Figure 3:
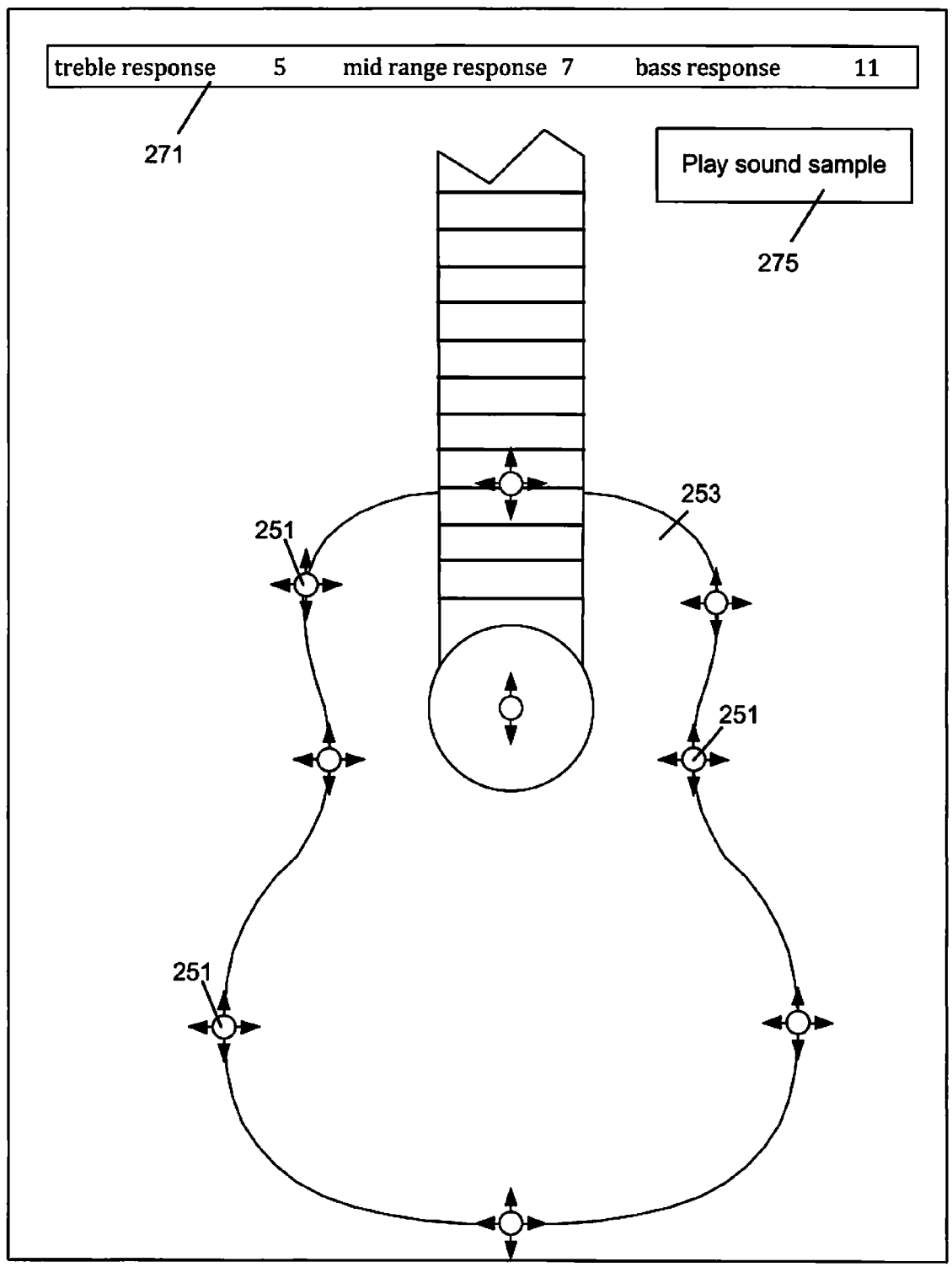
FIGS. 3-5 illustrate embodiments of graphical user interfaces for designing the string instruments.
Figure 4:
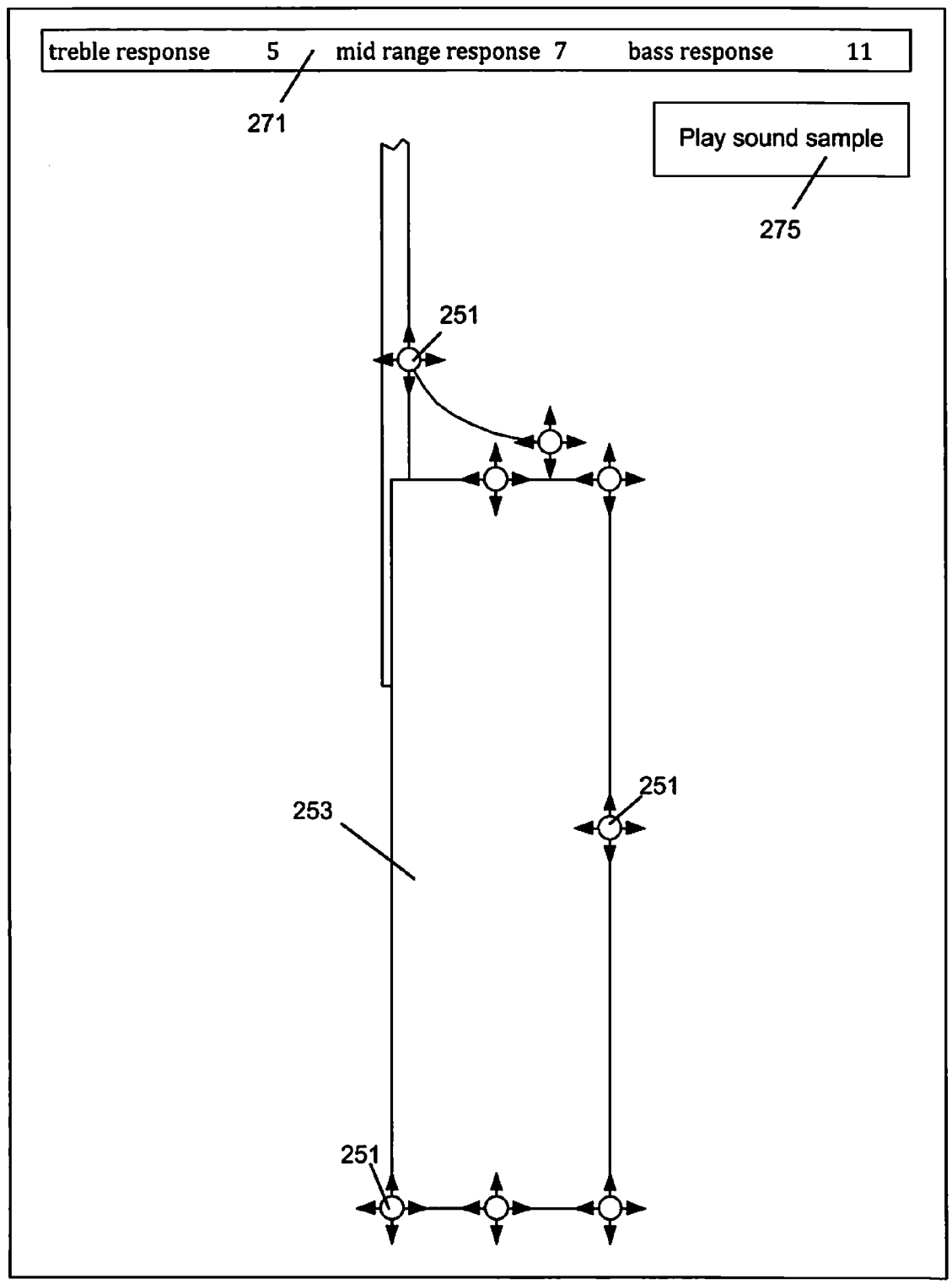
Figure 5:
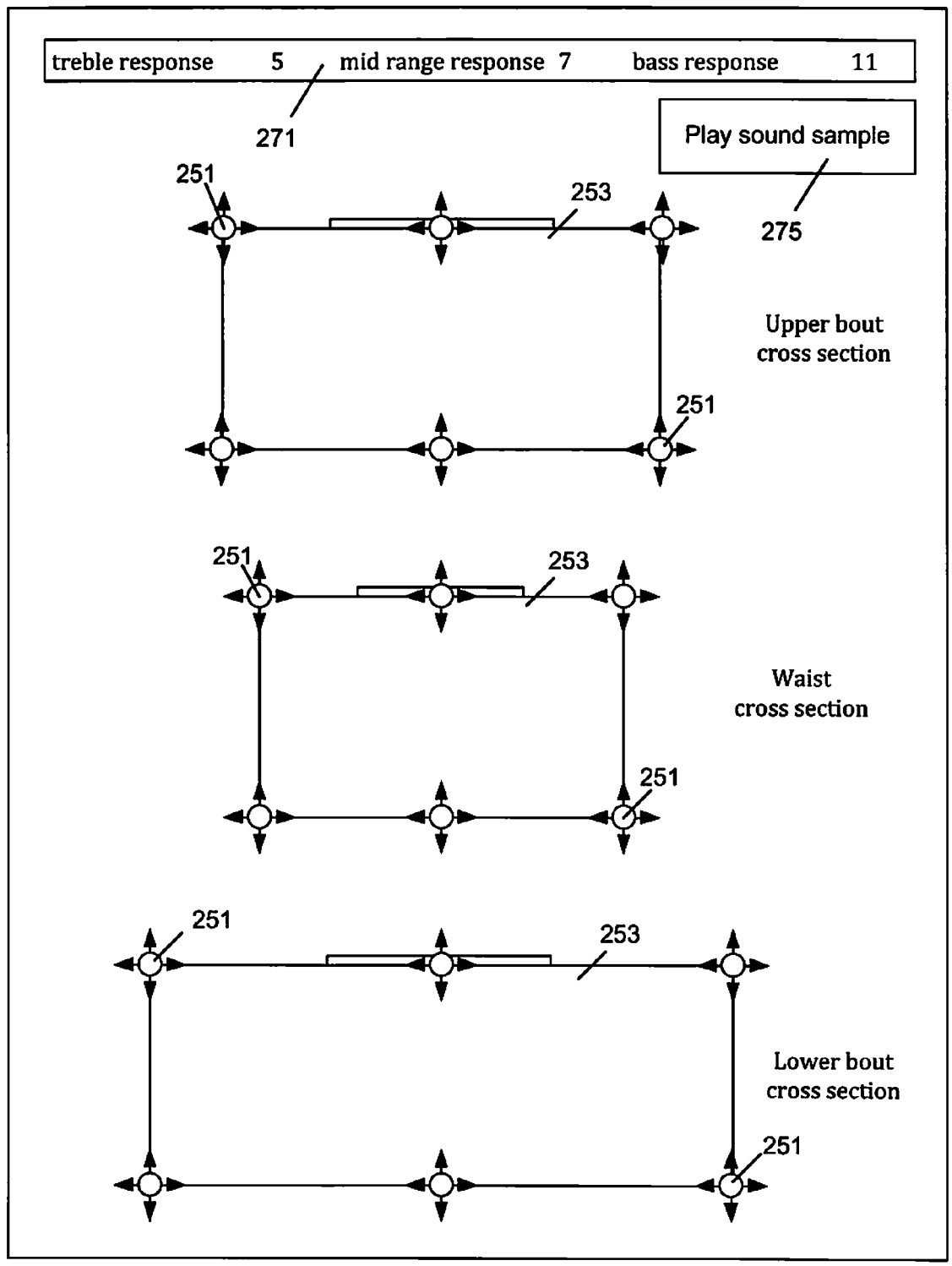

With reference to FIGS. 3-5, the client computers 207 can display CAD models and provide graphical user interfaces (GUIs) 300 which offer 'handles' 251 which invite the user to 'select and drag' with a client computer mouse or other input device in order to modify the shape of a digital representation of the guitar 253 or other instrument to their liking. These handles 251 can alter and influence the shape and contour of the guitar 253, by pushing or pulling certain regions or fundamental defining curves of the guitar 253.

FIG. 3 illustrates a front view of a guitar 253 which includes handles 251 around the edges. The designer can point and drag the handles 251 to alter the shape of the guitar 253. In this example, the center handles 251 allow the designer to alter the length of the guitar body. The handles 251 on the upper and lower bouts can allow the designers to adjust the width of the guitar 253 at the upper and lower bouts. The handles 251 on the waist can allow the designers to adjust the width of the guitar 253 at the waist.

In FIGS. 4 and 5, examples of GUIs are illustrated that show cross sections of the guitar string instrument. FIG. 4 illustrates a side cross section along the length. The handles 251 allow the designer to change the cross sectional shape of the guitar 253. For example, moving the handle 251 on the center of the back of the guitar 253 out of alignment with handles 251 at the back edges of the guitar can cause the surface of the back to be concave or convex. Similarly with reference to FIG. 5, by moving the handles 251 at the centers of the soundboard or back of the guitar can cause the soundboard or back of the guitar to be either planar, concave or convex.

The amount of influence that a user may exert can be restricted to be within predefined dimensional limitations defined by the parametric model. In an embodiment, the predefined dimensional minimum and maximum limits can be based on the ultimate fabrication process. A large 3D printing machine can produce larger guitars than a small 3D printing machine.

In addition to physical dimensions, in an embodiment the GUIs 300 may also include controls 271 in the user interface that can control the sound characteristics of the guitar design or other instrument. For example, the GUI may have sound modifying 'knobs' or sliders, or other controls that can allow a user to control the guitar's tonal attributes. By adjusting these controls 271, the user may, for example, increase the bass response of the acoustic guitar. They may also thicken the volume of the guitar body to create a guitar design with added output sound volume. In the illustrated examples, the controls 271 can be set with tonal qualities on a scale of 1 to 11. In this example, the treble has been set to 5, the mid range has been set to 7 and the bass response has been set to 11.

Alternatively, the controls can be used to make the guitar shorter and better suited to the end user's physique. The designer may experiment with various different geometries, in search of a shape or sound that fits their playing style. Thus, a designer may drive the design of the guitar either by the desired shape and/or size of the guitar, or by the desired sound of the guitar. When the user adjusts one or more of the tonal controls, the GUI will alter the design of the 3D CAD model of the guitar or other instrument to provide a design that has the user specified tonal qualities. In either case, the guitar body can represent their own unique creation.

Figure 6:
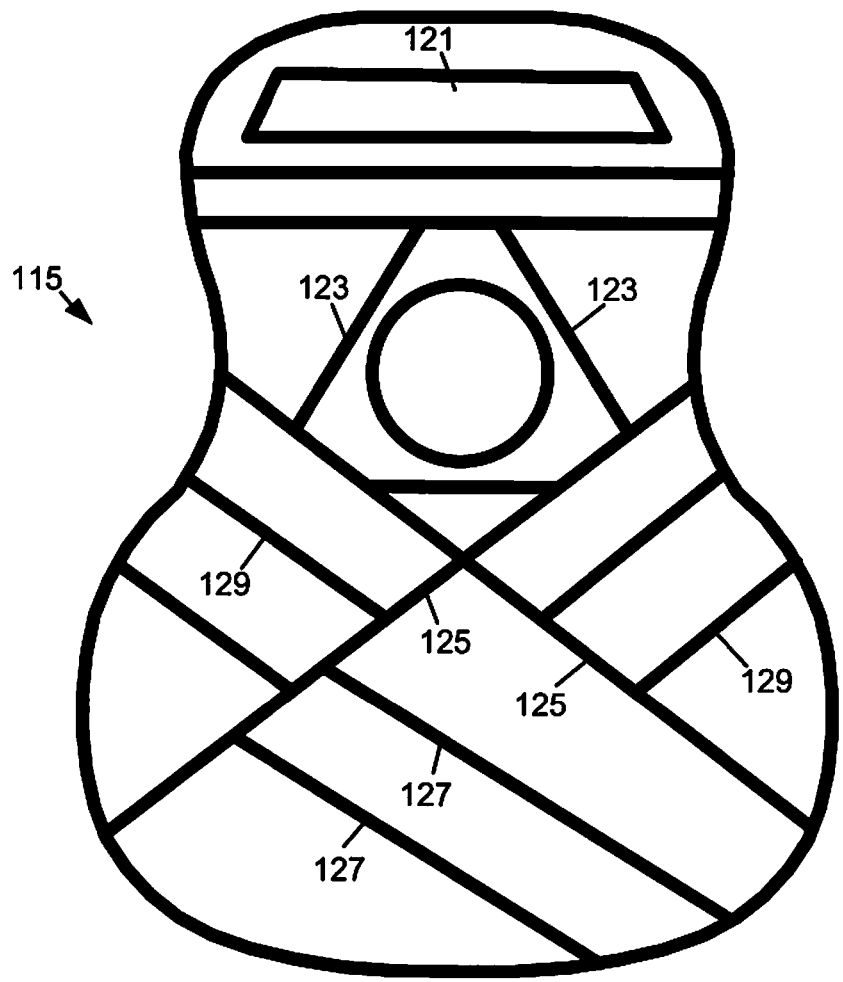
FIG. 6 illustrates an inner surface of a soundboard.

With reference to FIG. 6, an internal surface of a soundboard 115 is illustrated. The structure of the guitar can include both internal structural bracings and tone bars and surface attributes, which can influence the sound produced by the guitar. The soundboard 115 must support multiple acoustic modes and can be "tuned" with the use of "sound bars" that are attached to the inner surface of the soundboard 115.

In an embodiment, the bracing may be a default design, based on known principles of guitar acoustics, or in other embodiments, the bracings and sound bars may be customizable by the user, in search of a unique tonal quality. Since the bracings and sound bars directly impact the vibration of the soundboard 115 of the guitar, any modification to the bracings and sound bars will impact the resulting sound. With reference to FIG. 6, the illustrated embodiment of the inner soundboard 115 includes: a popsicle brace 121, finger braces 123, X-braces 125, tone bars 127, finger braces 129 and transverse braces 131. Bracing design and shape can affect the tone of the instrument. For example, scalloped braces can produce a warmer sounding bass response in the guitar with smooth mid range frequency output and crisp high frequency outputs. Parabolic braces can produce a quick response with a more pronounced mid range frequency output and a more focused lower frequency output. In an embodiment, the sound bars may have a width of 3 to 4 mm and a waist of less than 3 mm. The maximum height of these sounds bars is 5 to 5.5 mm, decreasing at the end of the sound bars.

The popsicle brace 121 is a strip of material that runs perpendicular to the neck of the guitar under the fretboard as a reinforcement to prevent cracks. Because of the improved structural integrity of the 3D printed guitar, the popsicle brace 121 may not be required. The X-braces 125 can consist of two braces 125 forming an X shape across the soundboard below the top of the sound hole 117. The lower arms of the X straddle and support the ends of the bridge 112. One or more tone bars 127 can support the bottom of the soundboard 115 and abut one of the X braces 125. The tone bars 127 can slant down towards the bottom edge of the soundboard 115. Above the sound hole a large transverse brace 131 spans the width of the upper bout of the soundboard 115. Around the lower bout, small finger braces 129 support the area between the X-braces 125 and the edge of the soundboard 115.

The use of additive manufacturing allows for non uniform cross sectional sound bars, non linear designs, cantilevered and pedunculated bars and other geometries that would be difficult to assemble with glue or adhesives and wooden elements. Fine tolerances allow for thinner or finer sound bars with secondary elements like branches on a tree. The fine tolerances and control of the additive techniques also allows for anisotropic sound bars for transmission of the sound down to the cavity. The unibody construction of soundbars with additive manufacturing is enabling for branched soundbars and finely tuned bars with non linear properties with regards to all parameters including but not limited to height, width, thickness, cross sectional shape, etc.

Shape and textures may be digitally applied to any surface of the guitar while it is in its digital, CAD state. These may be regular and geometric, or irregular and unevenly applied. They may appear only on the outside as a graphic detail, or on the inside as a way to alter the tonal properties of the guitar. Below are examples of various shapes and ornamental patterns which may be applied to any surface of the guitar in order to influence the sound.

Figure 7:
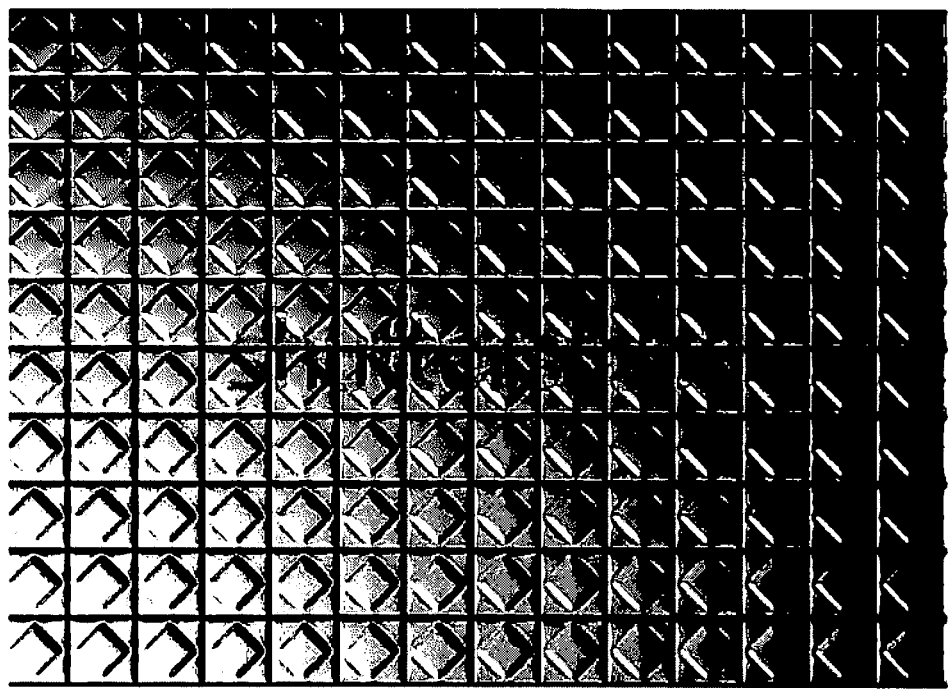
FIGS. 7 and 8 illustrate textures that can be applied to surfaces of the string instrument.
Figure 8:
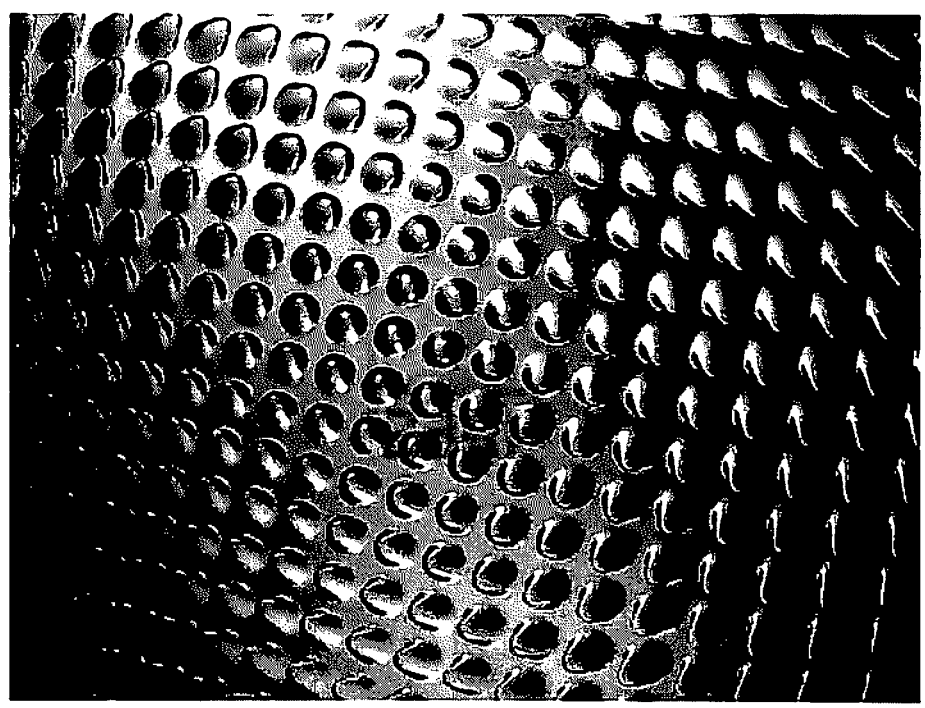

Because additive fabrication through 3D printing does not require planar surfaces or flat materials, the inventive system can be used to digitally apply a texture to any surface of the guitar while it is in its digital, CAD state. These may be regular and geometric, or irregular and unevenly applied. They may appear only on the outside as a graphic detail, or on the inside as a way to alter the tonal properties of the guitar. FIGS. 7 and 8 illustrate examples of bump or texture patterns which may be applied to any surface of the guitar in order to influence the sound. Very fine details can be incorporated in the design of non-load bearing structures that do not require assembly, while preserving the durability of the instrument.

The inventive process ultimately creates a design which can be 3D printed, using any number of additive fabrication technologies. In a preferred embodiment, 'selective laser sintering' can be used to create large, accurate fabrication of parts from polyamide powder. The resulting structures are both strong and resilient enough to offer the proper resonance and strength. Other possible fabrication technologies may include, but are not limited to, stereolithography, which creates parts from a liquid photopolymer.

With reference to FIG. 1, in an embodiment, the guitar's 107 neck may be assembled as an existing stock part. In other embodiments, the neck 107 may be 3D printed as well as the body, offering both unique tonal attributes, as well as ergonomic benefits. One such benefit would involve creating the fretboard 120 of the guitar as a twisted shape, which would allow the musician to hold their non-strumming hand at a more ergonomic and natural position when playing the guitar at the 'low' end of the strings. In this case, the fretboard 120 and neck 107 would twist away from the body 109, allowing the hand to be held in a flatter orientation, and less pronated or supinated, leaving it in a more natural position. In this configuration, the fretboard 120 and neck 107 would have an upper surface that is not parallel to the surface of the body 109.

A problem with stringed instruments is that the strings apply high compressive forces across the modular assembly of the neck 107 and body 109 of the guitar 100. The soundboard 115 of the guitar 100 across which these forces are applied must withstand high compressive forces. However the quality of the vibration of the soundboard 115 surface is responsible for the tone and quality of the sound of the guitar 100. So the guitar 100 may have a set of buttressing and supporting structures to support the mechanical loads while allowing for the thinnest soundboard 115 of the guitar 100 possible with the mechanical constraints. The development of new body 109 cavities and shapes may also require renewed iteration on the mechanical design of the guitar 100.

The use of additive manufacturing allows for a unibody construction of headstock 101, neck 107 and soundboard 115 of the guitar 100 to provide the longitudinal compressive forces applied by the strings. In addition use of FEA analysis coupled with acoustic analysis of the novel guitar shapes allows for the supporting structures and reinforcing structural elements to be optimally distributed to correlate with the acoustic characteristics of the soundboard 115.

Figure 9:
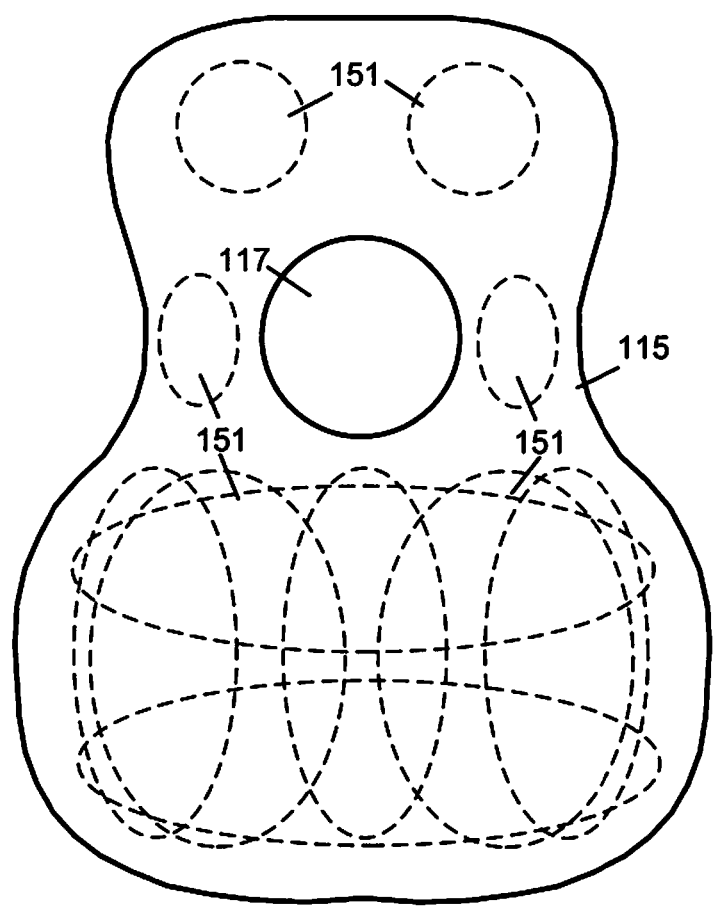
FIG. 9 illustrates resonant zones of a soundboard.

In an embodiment, the inventive system may be able to perform vibration analysis on the guitar. With reference to FIG. 9, using vibration analysis, the resonant neutral zones along the soundboard 115 can be identified and structural elements can be aligned with the non-resonant zones of the soundboard 115. Because the structural elements may only be aligned with non-resonant zones, the resonant neutral zones can be free to vibrate and produce sound. The acoustic zones 151 of the soundboard 115, which are the surface areas amplifying and transmitting sounds, can be manufactured with a minimal thickness optimized for best acoustic characteristics and performance.

Based upon known acoustic principles, there is a fundamental difference between a classical guitar and a violin in the way the sound is produced. In both instruments the energy of the vibrating strings has to be transported via the bridge to the soundboard. However, finger picking the guitar strings leads to a short excitement of the strings. In contrast, in the case of a violin, the energy is more or less continuously added by the fiddle stick to the strings. In the case of a violin the vibration of the strings brings the bridge into a movement, perpendicular to the top. On a guitar the wriggling movement of the bridge can give rise to the waves in the soundboard of the guitar. In designing a guitar understanding this difference is of primary importance.

Because the wriggling movement of the bridge is the main way the soundboard is excited, the dimensions and the other characteristics of the bridge of a guitar play a very significant role in the guitar design. Because of the limited energy of separate notes of the guitar string, every bit of vibration energy should be used to generate the desired sound. But unfortunately the efficiency of that mechanical to sound vibration process is low. For a "standard" classical guitar only 5 to 7% of the energy applied to the string is converted into sound waves. Thus, one of the main challenges in the design and construction of a guitar can be to design a guitar that has a high or optimized energy efficiency. This optimization can include eliminating possible vibration dampening features and structures.

With reference to FIG. 1, there are some basic guitar 100 design requirements. For example, the connection points of the strings have to be fixed. The saddle 119 has to be a hard fixed point related to the nut 102. Thus, the neck 107, headstock 101 and nut 102 must be rigidly constructed. The connections of the neck 107 and the bridge 112 must be rigidly secured to the body 109 and should be substantially parallel to the longitudinal axis. In order to provide the optimum acoustic performance, the neck 107 and the bridge 112 should be inflexible. Even the saddle 119 and the nut 102 have to be shaped in such a way that the strings will not lose energy to guitar 100 structure. The bridge 112 transports the energy of the strings to the soundboard 115 and should not absorb any vibration energy. The guitar should also not deflect or deform from large momentum of its own and not by internal heat absorption by compressing or bowing motions. The bridge 112 and saddle 119 should be as light, rigid and inflexible as possible.

The soundboard 115 forms the vibrating membrane, which emits sound waves and music. The sound waves, introduced in the soundboard 115 should transform their energy into airwaves and also fade away slowly to show the desired sustain for the pitch involved. The bridge 112 should be very light to allow the soundboard 115 to vibrate, but should also have enough strength not to be deformed by external forces it is subjected to.

The soundboard 115 assembly with the body 109 of the guitar can be similar to a frame principle. In an embodiment, the guitar body 109 can be designed and constructed as a solid, relatively inflexible frame on top of which the soundboard 115 is attached around the edges. That is in line with the idea that every "unnecessary" loss of energy should be prevented. So the primary acoustical function of the guitar body 109 is to the acoustic airwaves. This idea will lead to a guitar body 109 design that has relatively thick back and sides. However there are some "secondary" effects, which are in favor of a more flexible construction. However, in other embodiments, it can be desirable to design guitar bodies 109 with thin and flexible backs and sides. A thin body side 116 combined with a flexible lining allows the edge of the soundboard 115 to vibrate and thus enlarging the "effective" surface of the soundboard 115. This may give a small increase of the sound volume. Another advantage of flexible back 114 and sides 116 is that some standing waves in the guitar body 109 are supported. The end-effect of these different approaches can be characterized as either a more flexible body 109 that can produce more output volume or alternatively, a more rigid fixed body 109 can produce more sustain. In an embodiment, the inventive system can provide a user interface mechanism for controlling the flexibility and/or rigidity of the body 109. and instead of choosing one of the two we will look for a combination of rigidity and flexibility of back and sides.

Vibration Modes

Figure 10:
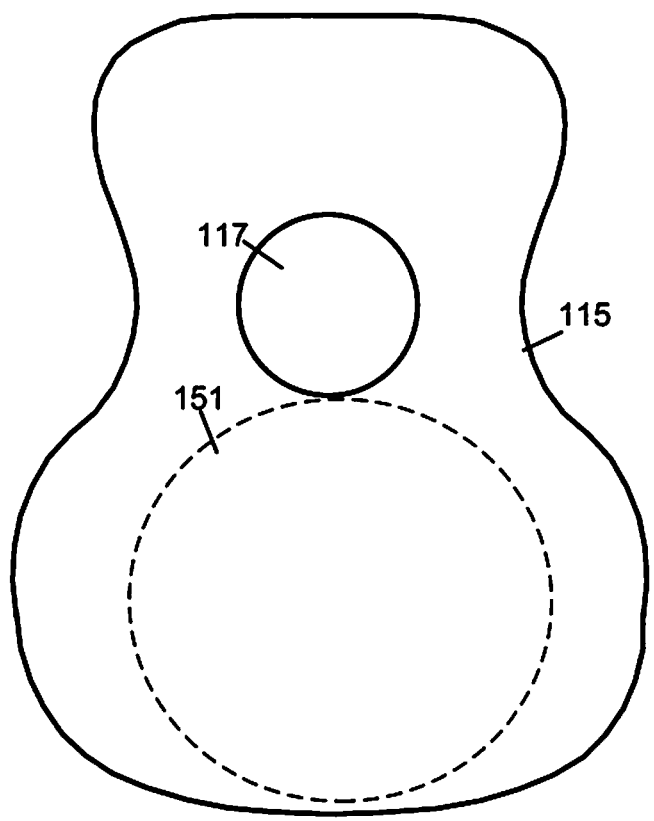
FIG. 10 illustrates a monopole vibration mode of a soundboard.
Figure 11:
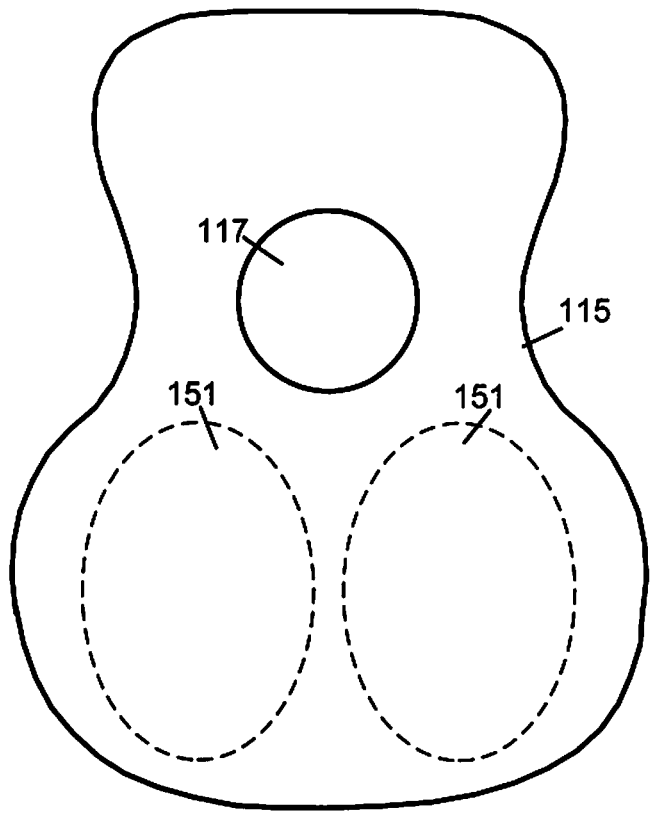
FIG. 11 illustrates a cross dipole vibration mode of a soundboard.
Figure 12:
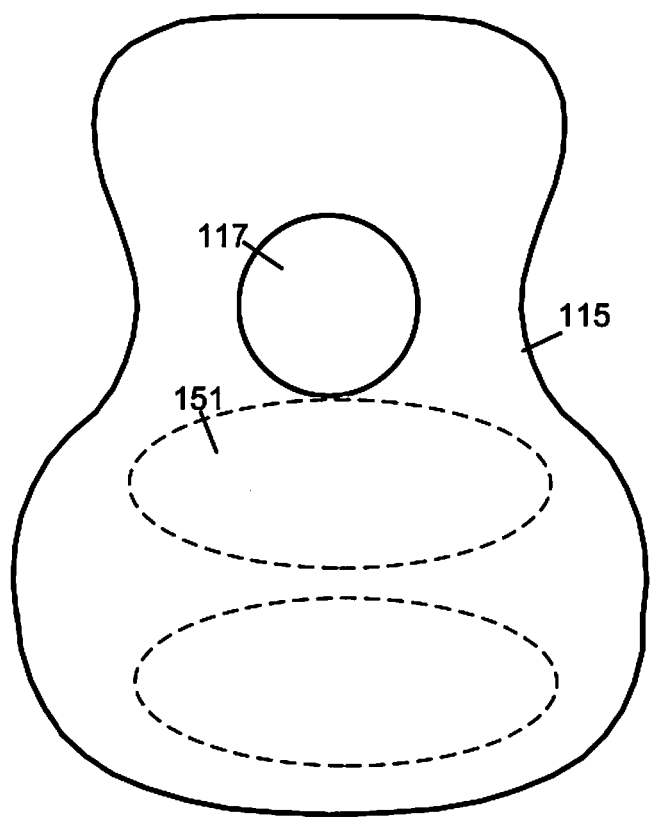
FIG. 12 illustrates a long dipole vibration mode of a soundboard.
Figure 13:
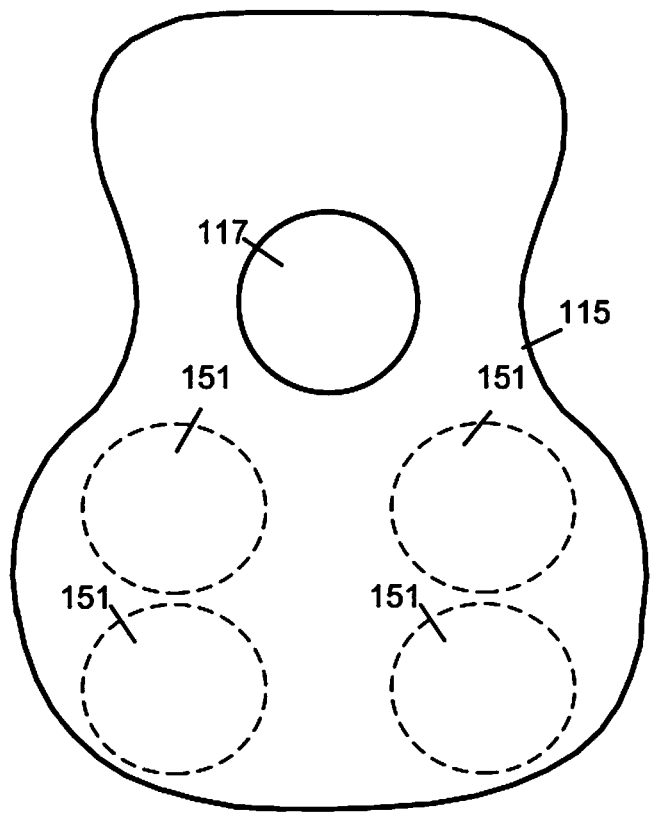
FIG. 13 illustrates a quadrupole vibration mode of a soundboard.
Figure 14:
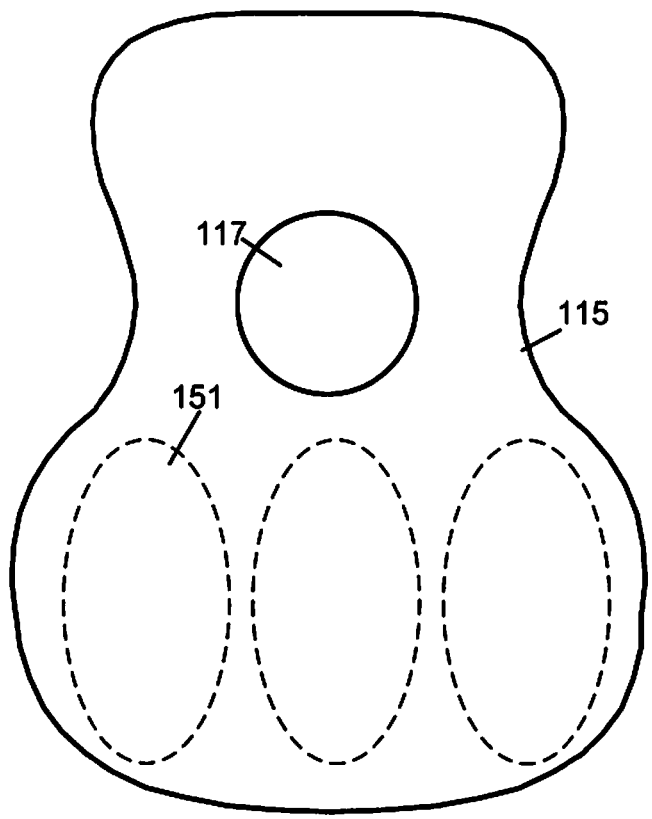
FIG. 14 illustrates a tripole vibration mode of a soundboard.
Figure 15:
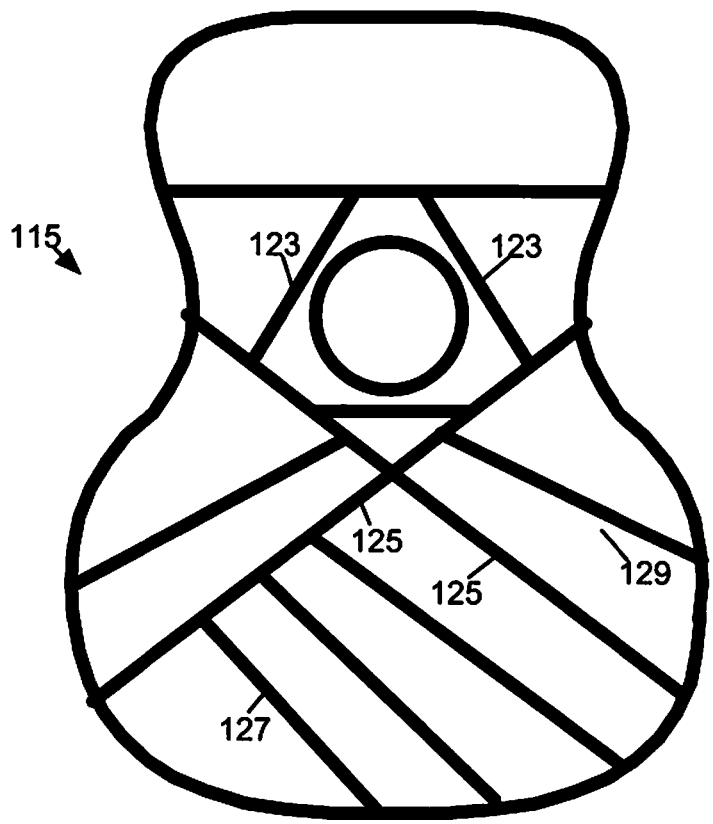
FIGS. 15-18 illustrate guitar designs and associated soundboard brace designs.
Figure 16:
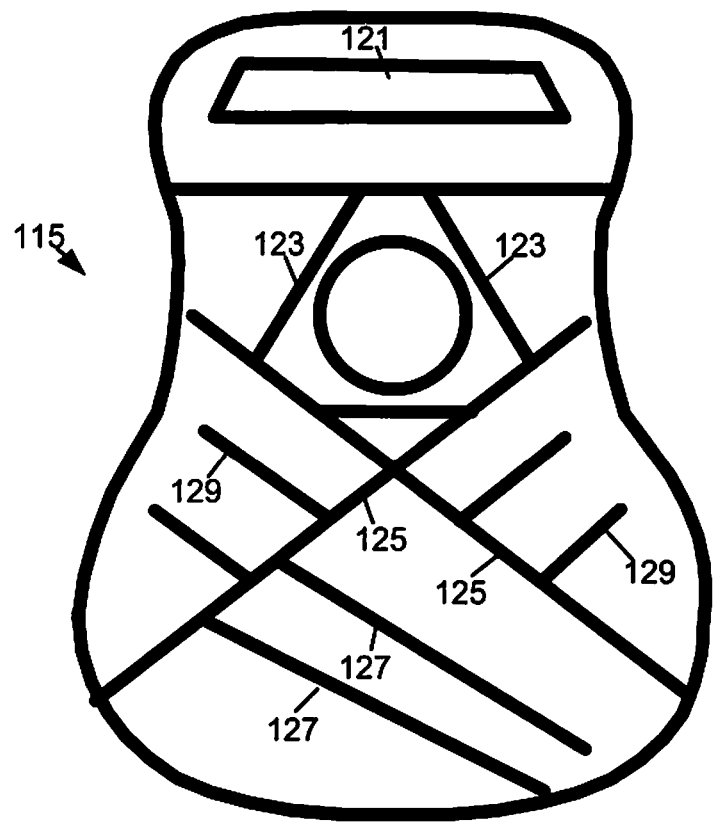
Figure 17:
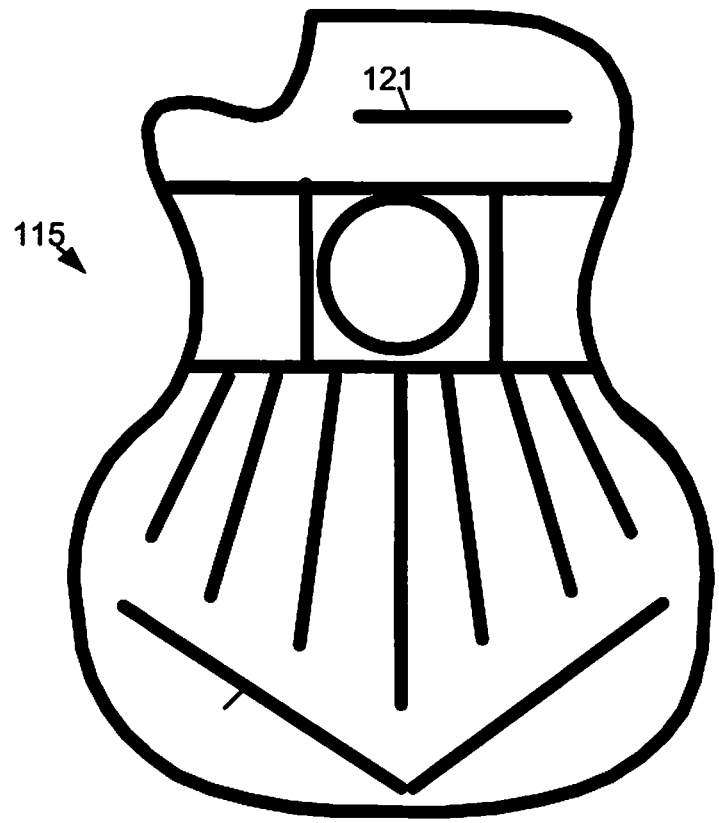

The traditional classical guitar top vibrates in many ways, but some fundamental frequencies below 500-600 Hz are of prime importance. These are the (0.0) monopole FIG. 10, (1.0) cross dipole FIG. 11, (0.1) long dipole FIG. 12, (1.1) quadrupole FIG. 13 and (2.0) tripole modes FIG. 14. In an embodiment, the inventive system can include a system for analyzing the vibration modes of the guitar body and based upon this analysis, the system can predict the sound of the guitar design.

Guitar Body Shapes

Figure 18:
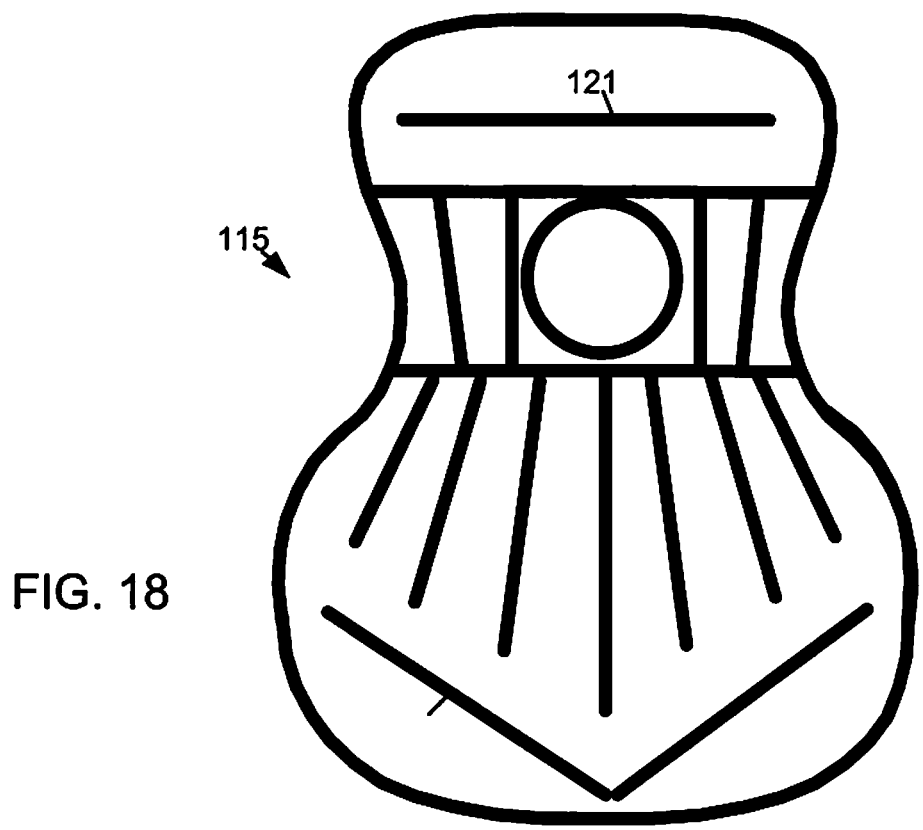

Acoustic steel-string guitars have been made in a variety of shapes and sizes and brace configurations. With reference to FIGS. 15-18, the inner surface of the soundboards 115 and braces for various guitars are illustrated. In order of size, beginning with the largest, there are five common steel-string acoustic designs: Jumbo shown in FIG. 15, Dreadnought shown in FIG. 16, Nex shown in FIG. 6, Artist shown in FIG. 17 and Folk which is not shown in a figure. The Artist and folk are the smallest steel-string designs. In contrast, Classic guitars FIG. 18 are typically made in one basic shape and size which is about the same size as the folk steel string guitar. Small guitar bodies tend to favor mid-range and treble and are easier to hold. For example, the Nex and Artist styles have increased midrange and treble response than a dreadnought or a jumbo. Smaller body guitars can also have a more balanced sound. In contrast, large bodies have more bass response. Thus, large guitar bodies, especially the dreadnought provide more boom and twang. The cutaway on the upper bout allows easy upper fret access but reduces volume and bass response by 10% to 20%. In an embodiment the user interface for the guitar design controls can allow a user to select a basic design which may include some or all of the guitars illustrated in FIGS. 6 and 15-18. The user interface controls can then allow the designers to modify the basic designs.

The following drawings illustrate an embodiment of a user interface that allows a user to design a guitar or other musical instrument on a client computer. The shape, thickness, length and width of the guitar can be controlled by the handles which are illustrated on a digital representation of the guitar design. The handles can be manipulated by a pointing device such as a computer mouse, trackball or other pointing device. The website may also provide other design controls including acoustic characteristic controls. In this embodiment, the user interface may provide controls for treble, mid range and bass responses. These numbers may be on a scale from 1-11 and the input numbers may cause the guitar design to be altered to provide the specified acoustic characteristics. In this example, the bass response is a larger value than the treble and mid range values. Thus, the system may increase the volume of the guitar to increase the bass output. This may be done by making the guitar body wider and thicker than the normal design.

In an embodiment, the user interface may include a predicted playback control. The server may be able to predict the sound based upon current design state of the guitar. In order to predict the sound that would be produced, the system may use empirical data, computer modeling or other sound prediction methods. The user may then be able to make modifications to the design and obtain additional sound quality predictions. The differences in the sound quality would be based upon the design changes. This feature may be actuated by pressing a button 275 on the user interface. In the example embodiments illustrated in FIGS. 3-5, the button 275 is marked "Play sound sample."

The present disclosure, in various embodiments, includes components, methods, processes, systems and/or apparatus substantially as depicted and described herein, including various embodiments, subcombinations, and subsets thereof. Those of skill in the art will understand how to make and use the present disclosure after understanding the present disclosure. The present disclosure, in various embodiments, includes providing devices and processes in the absence of items not depicted and/or described herein or in various embodiments hereof, including in the absence of such items as may have been used in previous devices or processes, e.g., for improving performance, achieving ease and/or reducing cost of implementation. Rather, as the following claims reflect, inventive aspects lie in less than all features of any single foregoing disclosed embodiment.

What is claimed is:

1. A system for designing an acoustic string instrument comprising:
   a user interface of a computer that displays a digital representation of a body of the acoustic string instrument that includes a soundboard with a sound hole and an internal body volume, the user interface having a plurality of controls that allows altering a design of the body of the acoustic string instrument; and
   a database that stores the design of the body, the soundboard, the soundboard and the internal body volume of the acoustic string instrument.

2. The system of claim 1 further comprising:
   a sound prediction program on the computer for predicting a sound of the acoustic string instrument.

3. The system of claim 2 wherein a description of the sound of the acoustic string instrument predicted by the sound prediction program is output by the computer.

4. The system of claim 2 wherein audio signals of the sound of the acoustic string instrument predicted by the sound prediction program are output by the user interface.

5. The system of claim 1 wherein the plurality of controls includes a first control for changing a first dimension of the body.

6. The system of claim 1 wherein the plurality of controls includes a second control for changing a convex curvature of a back of the body.

7. The system of claim 1 wherein the plurality of controls includes a third control for changing a convex curvature of the soundboard of the body.

8. A system for designing an acoustic string instrument comprising:
   a server coupled to a plurality of client computers through a network, the server providing a user interface to each client computer that displays a digital representation of a body of the acoustic string instrument that includes a soundboard with a sound hole and an internal body volume, the user interface having a plurality of controls that allows altering a design of the body of the acoustic string instrument; and
   a database coupled to the server that stores the design of the body, the soundboard, the soundboard and the internal body volume of the acoustic string instrument.

9. The system of claim 8 further comprising:
   a sound prediction program on the server for predicting a sound of the acoustic string instrument.

10. The system of claim 9 wherein a description of the sound of the acoustic string instrument predicted by the sound prediction program is output on the client computer.

11. The system of claim 9 wherein audio signals of the sound of the acoustic string instrument predicted by the sound prediction program are output to the client computers.

12. The system of claim 8 wherein the plurality of controls includes a first control for changing a first dimension of the body.

13. The system of claim 8 wherein the plurality of controls includes a second control for changing a convex curvature of a back of the body.

14. The system of claim 8 wherein the plurality of controls includes a third control for changing a convex curvature of the soundboard of the body.

15. A method for designing an acoustic string instrument comprising:
   providing a user interface on a computer that displays a digital representation of at least a body of the acoustic string instrument that includes a soundboard with a sound hole and an internal body volume, the user interface having a plurality of controls;
   using the plurality of controls to design of the body of the acoustic string instrument; and
   storing the design of the body, the soundboard, the soundboard and the internal body volume of the acoustic string instrument in a database.

16. The method of claim 15 further comprising:
   providing a sound prediction program on the computer for predicting a sound of the acoustic string instrument.

17. The method of claim 16 further comprising:
   displaying a description of the sound of the acoustic string instrument predicted by the sound prediction program on the computer.

18. The method of claim 16 further comprising:
   outputting audio signals of the sound of the acoustic string instrument predicted by the sound prediction program from the user interface.

19. The method of claim 15 further comprising:
   changing a first dimension of the acoustic string instrument using the plurality of controls.

20. The method of claim 15 further comprising:
   changing a convex curvature of a back or the soundboard of the body using the plurality of controls.

* * * * *